(12) United States Patent
Prymak

(10) Patent No.: US 6,917,510 B1
(45) Date of Patent: Jul. 12, 2005

(54) EXTENDED TERMINAL CERAMIC SMD

(75) Inventor: John D. Prymak, Greer, SC (US)

(73) Assignee: Kemet Corporation, Greenville, SC (US)

( * ) Notice: Subject to any disclaimer, the term of this patent is extended or adjusted under 35 U.S.C. 154(b) by 0 days.

(21) Appl. No.: 10/974,225

(22) Filed: Oct. 27, 2004

(51) Int. Cl.[7] ............ H01G 4/228; H01G 4/248
(52) U.S. Cl. .................... 361/309; 361/310
(58) Field of Search .......... 361/301.2, 301.4, 361/306.1, 306.3, 307, 308.1, 308.2, 308.3, 309, 310

(56) References Cited

U.S. PATENT DOCUMENTS

| | | | | |
|---|---|---|---|---|
| 3,665,267 A | * | 5/1972 | Acello | ............ 361/309 |
| 6,519,134 B1 | * | 2/2003 | Li et al. | ............ 361/306.1 |
| 6,704,189 B2 | * | 3/2004 | Yoshii et al. | ............ 361/308.1 |
| 2002/0067588 A1 | * | 6/2002 | Monsorno | ............ 361/306.3 |
| 2004/0223290 A1 | * | 11/2004 | Sutardja | ............ 361/306.3 |

* cited by examiner

*Primary Examiner*—Eric W. Thomas
(74) *Attorney, Agent, or Firm*—J. Herbert O'Toole; Nexsen Pruet, LLC

(57) ABSTRACT

Larger ceramic chip capacitors are reliably mounted with minimal risk of flexure induced cracking on circuit boards by adding terminal extensions to one face of the capacitor and soldering across all or part of the extensions. A ball grid array is preferred.

4 Claims, 12 Drawing Sheets

(Prior Art)

(Prior Art)

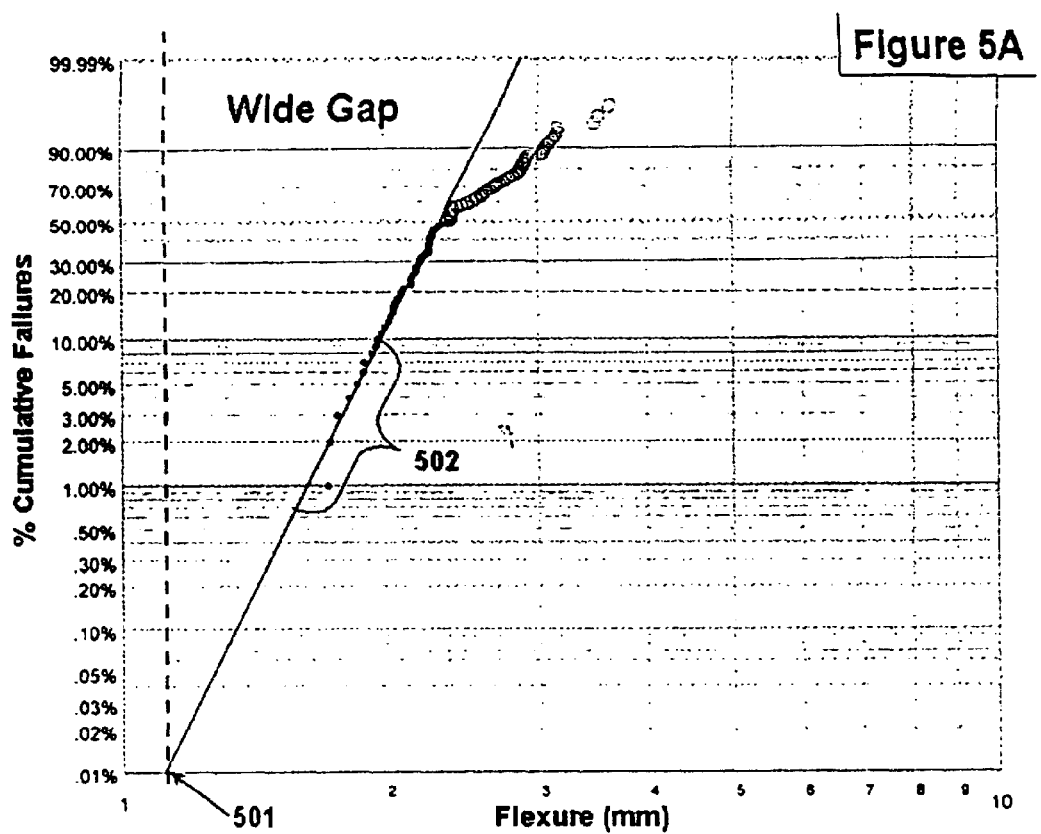

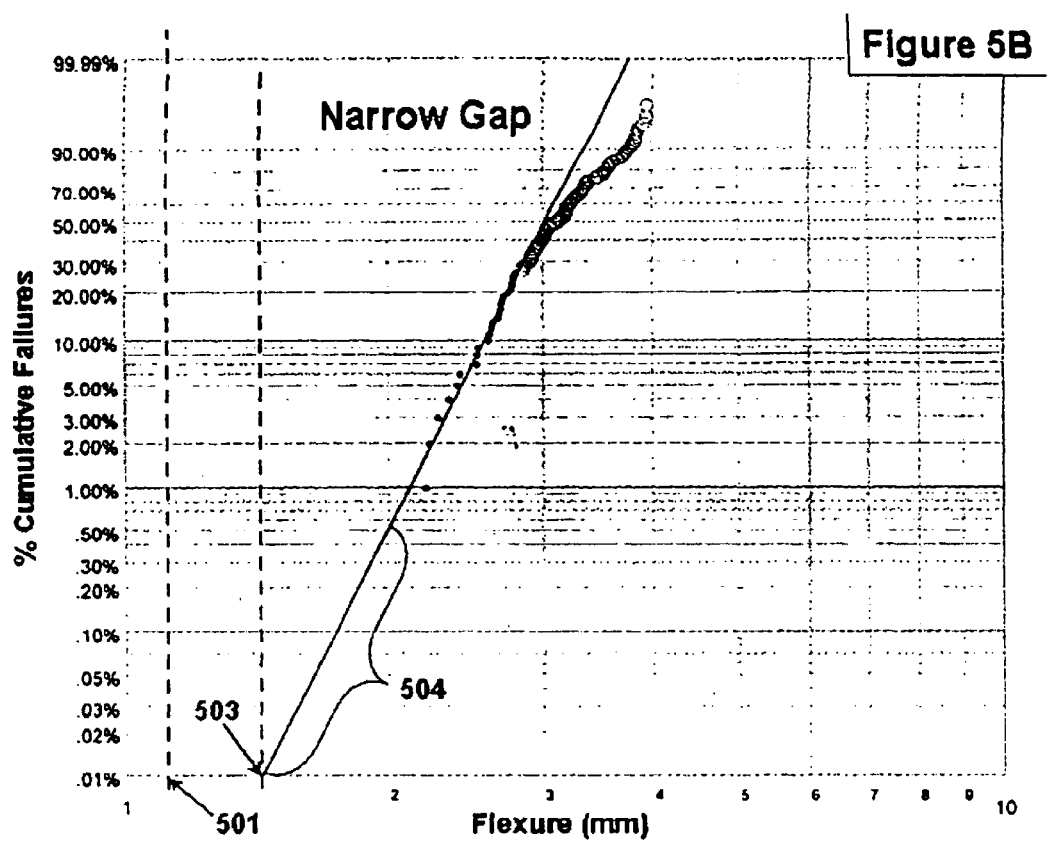

Figure 6
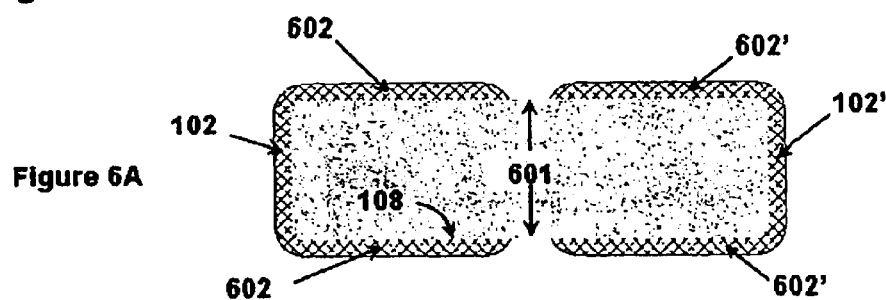
Figure 6A
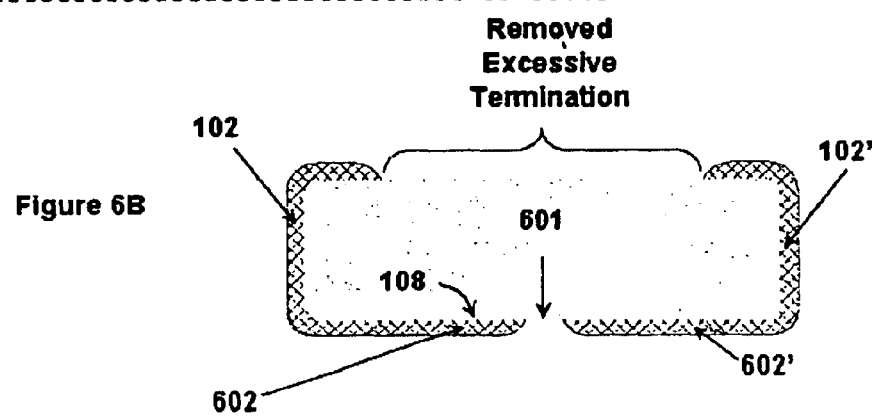
Figure 6B

US 6,917,510 B1

EXTENDED TERMINAL CERAMIC SMD

FIELD OF THE INVENTION

The present invention is related to large ceramic chips (larger or equal to size 1206) and structures and methods for reducing the susceptibility to flex or mechanical cracking.

BACKGROUND OF THE INVENTION

Capacitors, are well known in the art of electrical components. Capacitors typically comprise parallel plates, which act as anodes and cathodes, respectively, with a dielectric therebetween. The function of capacitors is well known and further discussion is not warranted herein.

Capacitors are typically secured to a substrate as a supporting component of an integrated circuit. A particularly relevant integrated circuit comprises a microprocessor mounted to a printed circuit board (PCB) with capacitors mounted on the opposite side of the PCB in a sandwich type arrangement. This arrangement, while long utilized in the art, is now a limiting factor in the further ongoing miniaturization and speed increase of modern day circuitry. This arrangement is now limiting due to the propensity for ceramic capacitors to form cracks, and therefore fail, when subjected to flex stresses.

It is well known that stress cracking is exacerbated in larger ceramic capacitors. As the size of a capacitor increases the separation distance between the external electrodes or terminations increases. Any flex in the substrate is therefore amplified relative to a small capacitor with close termination leads. One widely known method for preventing stress fractures is to utilize lead frames, as illustrated in FIG. 2, to elevate or suspend and mechanically isolate the capacitor. The lead frame dissipates stress thereby protecting the capacitor. This method has been widely used in the past yet the length of the lead frame is contrary to ongoing efforts to reduce thickness, inductance, and resistance thereby rendering this method obsolete for modern circuits with increased demands for thinner and lower inductance and resistance. Reducing the separation between the capacitor and substrate has been considered impossible due to problems associated with solder flowing upward and causing elimination of the mechanical independence of the leadframe system.

The present invention provides a novel capacitor presentation, which greatly decreases the propensity for stress fractures from flexing. The novel capacitor achieves these previously unobtainable goals while still maintaining the ceramic capacitor performance and higher capacitance capabilities in chips equal to or larger than EIA size 1206.

SUMMARY OF THE INVENTION

It is an object of the invention to provide a ceramic capacitor which is less susceptible to stress fractures while eliminating the costly leadframe structure with its added dimensions. The final device is a standard solder processed, surface mount capacitor.

A particular feature of the present invention is the ability to secure the inventive capacitor to a substrate by a ball grid array, solder strips or full termination without decreasing the improved properties.

These and other advantages, as will be realized, are provided in a ceramic capacitor having novel terminations and stress distributions. The ceramic capacitor comprises a multiplicity of parallel plates in planar relationship. Each plate terminates at an opposing face in an alternating pattern. A dielectric is between the parallel plates. Two external terminations are on opposing sides of the capacitor wherein a first external termination is in electrical contact with a first multiplicity of alternating parallel plates and a second external termination is in electrical contact with separate alternating parallel plates than the first external termination.

First and second terminations are applied by termination dip such as in a suspension slurry of metallic particles with a glass first. In a first embodiment, the depth of the dip is increased to coat a deeper portion of the ceramic, resulting in a decrease in the gap between the first and second terminations. When attached to solder pads, the length of exposed ceramic between the bottom, internal termination gap is reduced.

In a second embodiment, the metalizations of the ends of the capacitors is done by a screening or plating process instead of, or after, a dipping process to limit metalization to the ends of the capacitors, and to those portions to be brought into contact with the solder pads.

In a third embodiment, the terminations are extended on one face of the capacitor to provide a large electrical contact area in contact with the solder pad of the PCB.

In a fourth embodiment of the invention, the size and shape of the solder pads are changed to be discontinuous such as by strips of pads or a ball grid.

These objectives are obtained by processes which maximize the electrical contact area of the PCB side of a ceramic capacitor and by adapting the shape an size of the solder pads to minimize spread of solder during reflow.

BRIEF DESCRIPTION OF THE DRAWINGS

FIGS. 5 and 5B are the comparative flex testing results of the chips defined in FIGS. 4A and 4B.

FIGS. 6A and 6B illustrate an exaggerated narrow gap created by a deep dip in the termination material to create an extended termination, and the "bottom face only" treatment of the extended termination.

DETAILED DESCRIPTION OF THE DRAWINGS AND INVENTION

The invention will be described with reference to the drawings which form an integral part of the disclosure. In the various drawings similar elements will be numbered accordingly.

Figure 1:
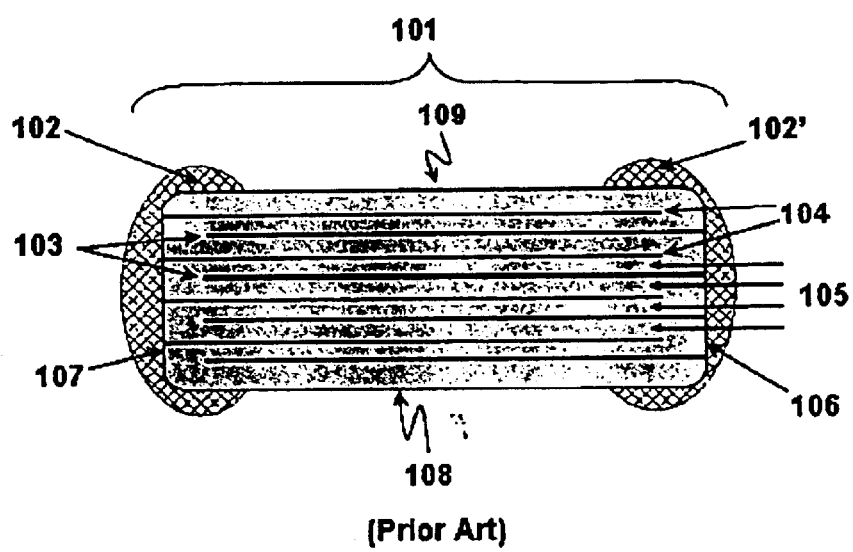
FIG. 1 is a cross-sectional view of a ceramic capacitor.

The configuration of ceramic multilayer capacitors is well known in the art. With reference to the FIG. 1, an exemplary structure of a prior art multilayer ceramic chip capacitor, 101, is shown. FIG. 1 shows a cross sectional view of the three-dimensional capacitor chip, 101. The shape of the capacitor chip, 101, is not critical although it is often rectangularly shaped. Also, the size is not critical and the chip may have appropriate dimensions in accordance with a particular application, typically in the range of 1.0 to 5.6 mm×0.5 to 5.0 mm×0.5 to 1.9 mm.

The capacitor chip, 101, has alternately stacked internal electrode layers, also known as plates, 103 and 104. In FIG. 1, the ceramic capacitor chip, 101, is non-polar because the plates are oppositely charged, positive and negative, when connected to an energized circuit and can be charged in either direction. Dielectric layers, 105, separate the internal electrode layers, 103 and 104. Further, the internal electrode layers, 103 and 104, are stacked so that internal electrode layers, 103, of one group are exposed at one side surface, 106, of the capacitor chip, 101, while internal electrode layers, 104, of another group are exposed at the opposite side surface, 107, of the capacitor chip, 101. The capacitor chip, 101, also has external electrodes, also known as terminations, 102 and 102'. One external electrode, 102, is applied to one side surface, 107, of the capacitor chip, 101, so that it is in electrical contact with one group of internal electrode layers, 104, of the capacitor chip, 101. Likewise, the other external electrode, 102', is applied to the opposite side surface, 106, of the capacitor chip, 101, so that it is in electrical contact with the other group of internal electrode layers, 103, of the capacitor chip, 101. The plate arrangement is usually with adjacent internal electrode layers, 103 and 104, terminating to opposite face terminations, 102 and 102', and non-adjacent internal electrode layers, 103 and 104, terminating to the same termination face, 102 or 102'. Further, the internal electrode layers or plates, 103 and 104, are offset in such a manner that they extend to the side surfaces, 106 and 107, of the capacitor chip, 101, but only at the external electrodes or terminations, 102 and 102'; otherwise, they are encased and insulated from all other faces by ceramic material. A desired capacitor circuit is completed in this way.

The terminations, 102 and 102', are metalizations and are applied to the ceramic of the capacitor chip, 101, using a termination dip. The terminations, 102 and 102', are applied typically as metallic particles suspended in slurry with a glass frit. The terminations, 102 and 102', are fired on opposing faces, 106 and 107, of the ceramic capacitor chip, 101, with the glass frit acting as a bonding agent between the now fused metal particles and the ceramic body.

In "normal" surface mount applications, where the chip capacitor, 101, is mounted to a PCB, the portion of the termination, 102 and 102', metalization, which wraps under (between the capacitor chip, 101, and the PCB) and extends a small distance along the bottom face, 108, of the capacitor chip, 101, is used as the main electrical contact to the PCB. With the bottom face, 108, of the capacitor chip, 101, adjacent to the PCB when mounted, flex cracks start at the extreme internal edges of the terminations, 102 and 102', along the bottom face, 108.

Figure 2:
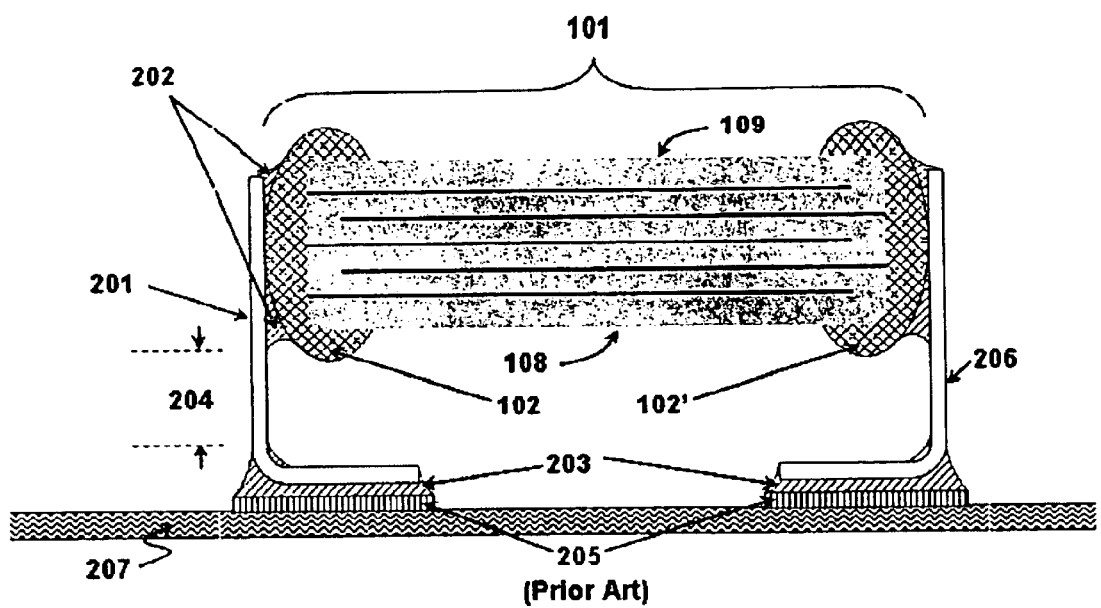
FIG. 2 is a cross-sectional view of a prior art capacitor with an offset lead frame.

FIG. 2 illustrates a cross-sectional view of a prior art capacitor comprising an offset lead frame arrangement. The leadframe, 201, is typically a copper, copper alloy, or nickel based material that is often plated with nickel, except when the leadframe is a nickel based material, with additional overcoats possible with tin, solder, or gold. The capacitor chip, 101, is normally mounted to the leadframe, 201, by means of solder, 202, or conductive epoxy attachment. The leadframe is then normally attached to the copper trace, 205, on the PCB, 207, surface by solder, 203. If solder, 202, is used to attach the leadframe to the capacitor chip, 101, it is usually a high temperature solder, such as 95% Sn-5% Pb MP 224° C. solder or 96.5% Sn-3.5% Ag MP 221° C. solder. A high temperature solder, 202, assures that the leadframe, 201, remains attached to the capacitor chip, 101, during the reflow temperatures encountered when the leadframe, 201, is attached to the PCB surface, 205. Those in the art will recognize that alternative solders for attaching the leadframe, 201, to the capacitor chip, 101, could be used to eliminate the use of lead-based solder.

The leadframe, 201, must rise a vertical distance, 204, to assure that solder cannot bridge and form a direct contact to the underside of the terminations, 102 or 102'. The vertical distance, 204, provides for a separation distance between the PCB surface, 205, and the bottom of the capacitor chip, 101.

In the "normal" surface mount application, as described above, flexure of the PCB creates changes in the distance between the termination pads, 205. With direct surface mount, this generates a sheer force between terminations 102 and 102' and within the ceramic body and inevitably causes the ceramic capacitor chip, 101, to crack. By utilizing the leadframe, 201, no sheer forces are transmitted to the suspended capacitor chip, 101. This is because the flexure between the PCB and solder, 203, that connects the leadframe, 201, to the PCB surface, 205, is absorbed by the mechanical flexure of the leadframe, 201, along the length 204.

While the vertical distance, 204, of the leadframe, 201, is free moving and is large enough to afford the capacitor chip, 101, mechanical relief sufficient to cover the worst of circumstances, the vertical distance, 204, offers additional unwanted resistance (electrical and thermal) and inductance between the capacitor chip, 101, and the circuit. Because of the additional length, 204, special fixturing is required in the attachment of the leadframe, 201, to the capacitor chip, 101, to maintain control of the vertical distance, 204. The vertical distance, 204, further creates mechanical instability of the capacitor chip, 101, since it is separated from the PCB surface, 205, in this manner.

Figure 3:
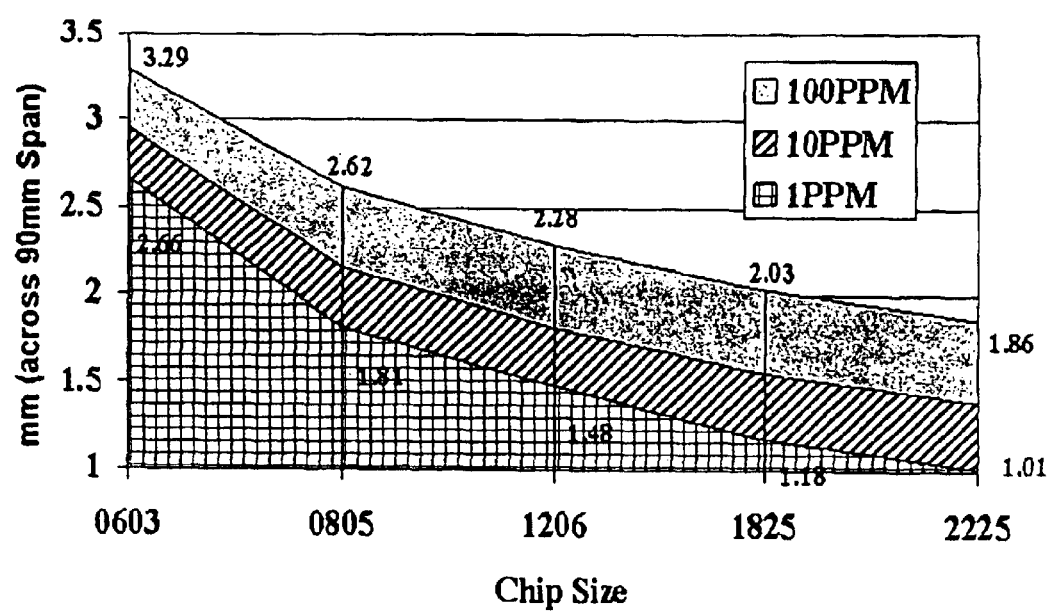
FIG. 3 is a plot of the susceptibility of ceramic chips to flex cracks versus the size of the chip.

FIG. 3 is a graphical presentation of flex crack susceptibility versus chip size. The vertical axis indicates the flexure or movement at the middle of a 90 mm PCB supported at opposite ends. Three levels of failure are plotted to indicate the flexure required to achieve 100-PPM, 10-PPM, and 1-PPM failure rates at the indicated deflections. As the chip size increases to the right of the plot, the flexure required to achieve these failure rates is decreasing. The larger the chip size, the greater the susceptibility to flex crack failure.

In FIGS. 4A and 4B, a cross section is shown for capacitor chips (1206 chip size), 101, from the same manufacturing lot that were processed through the termination dip, described above, to achieve two distinct patterns for the metalization wrap onto the bottom face, 108, of each capacitor chip, 101. The top capacitor chip, 101, FIG. 4A, utilized a conventional shallow dip for the end terminations (approximately 15 mils of coverage on top/bottom faces), 102 and 102', to create a wide band of ceramic, 401, between the metalizations at the bottom face, 108. The bottom capacitor chip, 101 FIG. 4B, represents a deeper dip into the metalization (approximately 45 mils of cover on top/bottom faces) to create a narrower ceramic gap, 402, between the metalizations and larger metalization wraps at the bottom face, 108.

Figure 4:
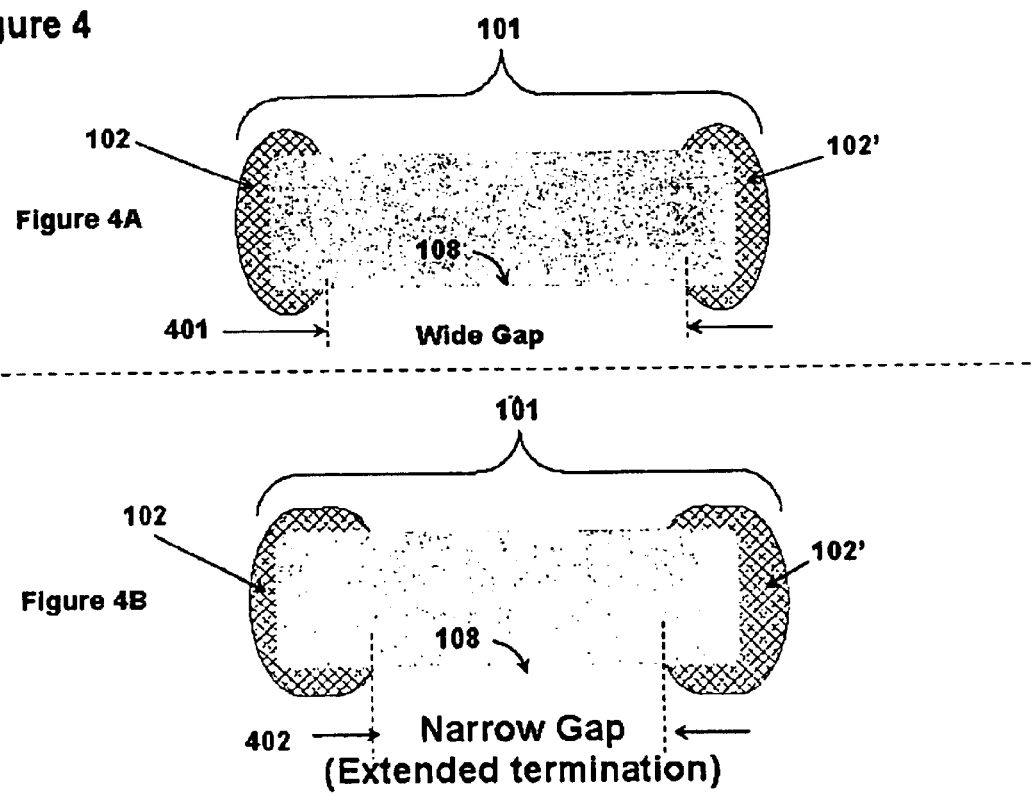
FIGS. 4A and 4B are comparative cross sectional view of two ceramic chips: one with a wide gap separation between termination overlap, and the second with a smaller gap separation.

The chips from FIG. 4 were tested to failure and the plots of the results are shown in FIGS. 5 and 5B. These figures represent the plot of the cumulative percentage failure (vertical axis) versus the flexure level of detected failure (horizontal axis). The cumulative percentage failure axis is a Weibull axis extending form 0.01% (100-PPM) at the bottom to 99.99% at the top, and the flexure scale is logarithmic from 1 mm to 10 mm of board deflection. The only difference in these groups was the size of the metalization wraps at the bottom face, 108, of the capacitor chip, 101. The distribution of the points of failure (measured in mm of flexure between a 90 mm span) of the "narrow gap" group, 502, is further to the right and therefore, has a higher flex capability than the "wide gap" group, 501. For example, when looking at 2 mm and lower of flexure of FIG. 5B, there are no failures in the "narrow gap" group, 504, versus 10% of failures at 502, fall below 2 mm in the "wide gap" group of FIG. 5A. The bottom level of these graphs represents 100-PPM failure rates. Looking at the projected flexure required to achieve 100-PPM failure rate for the wide gapped parts is 1.11 mm, 501 of FIG. 5A, while this same failure rate is achieved for the narrow gapped parts at 1.43 mm, 503 of FIG. 5B. This change represents nearly a 40% improvement for the narrow gapped parts versus the wide gapped parts.

FIGS. 6A and 6B show how this experiment might be modified to an extreme. The capacitor in FIG. 6A was dipped very deeply into the termination metals creating an extremely narrow gap between terminations, 102 and 102'. These wide terminations, 102 and 102', create a waste of materials because only the bottom face, 108, needs to have this treatment. To create less waste, metallized bottom termination extensions, 602 and 602', may be applied on the bottom face 108, prior to or after the normal application of the termination dip of the capacitor chip, 101. This method provides the option of only having an underside wrap, 602 and 602', as shown in the lower illustration of FIG. 6B and eliminates the top extensions, 603. Application methods for the extensions usually include thick film screening, electroless plating, sputtering, and chemical vapor deposition. The gap between the end terminations is reduced to a narrow region, 601, of 0.5 mm to 2 mm, the smaller being preferred.

Figure 7:
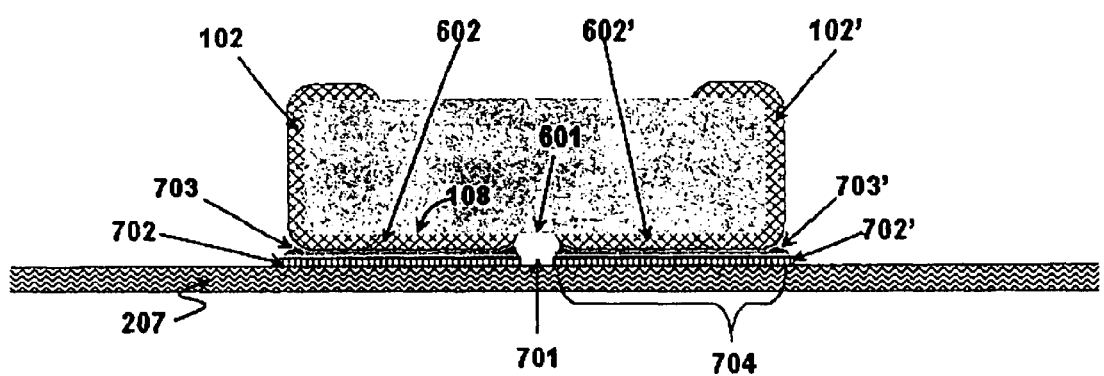
FIG. 7 is the resulting mount of this chip to a board with solder pad dimensions fit to the extended termination on the bottom face.

The termination extensions, 602 and 602', greatly increase flexure capability, but dealing with these vast terminations often presents problems. In FIG. 7, PCB solder pads, 702, discussed more thoroughly below, were designed to utilize the area of metalizations, 602 and 602', as in all other surface mount pad dimension recommendations. This design, however, creates an excessive amount of solder, 703 and 703', along the bottom of the capacitor chip, 101, and therefore, causes problems with bridging the gap, 701 or 601. The large amount of solder, 703 and 703', may easily enable a connection due to wicking of material across the gap, 701 or 601, and thereby, cause a "short circuit."

Figure 8:
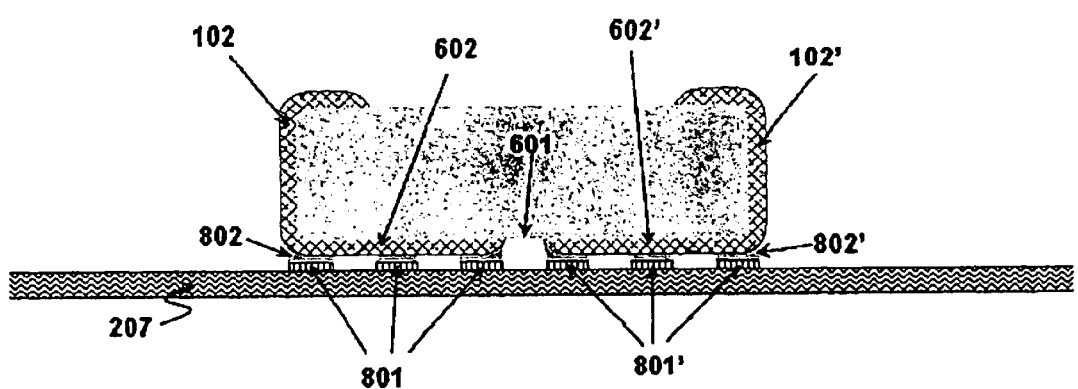
FIG. 8 is a drawing of the cross section view of a capacitor with extended terminations soldered to a PCB with striped termination pads.

The comparatively massive amount of solder can be eliminated using two methods. The first method includes creating on the PCB, a series of parallel striped pads, 801 and 801', as shown in FIG. 8. The series of parallel striped pads, 801 and 801', designate the placement of the solder, 802 and 802', for the attachment of the termination extensions, 602 and 602' to the PCB. The series of parallel striped pads, 801 and 801', greatly reduces the amount of solder required to attach the capacitor chip, 101, to the PCB, 207, because smaller amounts of solder are more likely to remain within their pad geometries. This method assures that the small gap, 601, created by the termination extensions, 602 and 602', remains open and non-conductive. To effectively use this design, it is necessary to increase the metallization thickness of extensions 602, 602' or limit the thickness of the terminations to obtain a flat contact surface separated from the ceramic body.

Figure 9:
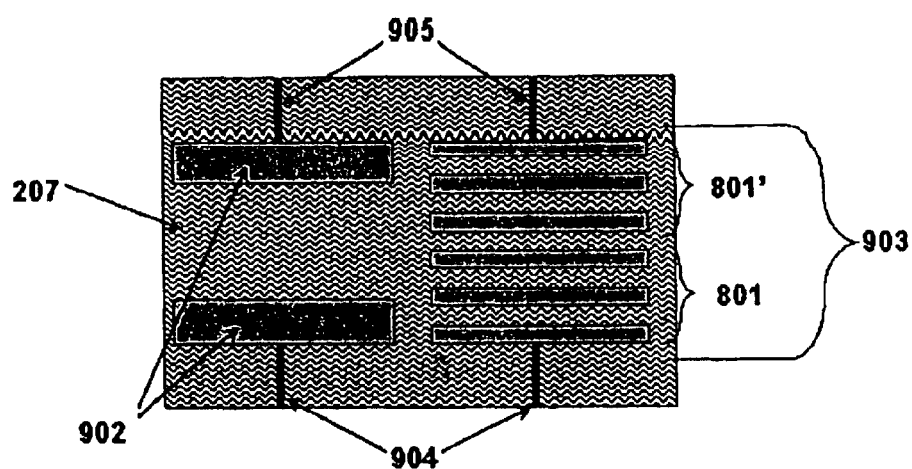
FIG. 9 is the pad designs for the standard 2225 chip, and a 2225 with extended terminations creating a striped pad mount.

FIG. 9 illustrates a PCB, 207, with the standard and striped solder pad arrangements. On the left of FIG. 9, are two PCB solder pads, 902, which represent the "normal" pad geometry for a size 2225 chip capacitor without termination extensions, 602 and 602'. Electrical feed, 905 and 904, is provided to and from a small portion of the perimeter of the solder pads, 902. As discussed above, this pad geometry is problematic because flex cracks start at the terminations, 102 and 102' resulting in a potential catastrophic failure of the capacitor. On the right of FIG. 9, the striped parallel pad arrangement, 903, is shown. Electrical feed, 904, 905, is only required to the outermost pads of the striped parallel pad arrangement, 903, because the other pads are connected electrically by the termination extensions, 602 and 602'. The three parallel striped pads, 801', at the top are electrically common with one termination, 602 or 602' while the three parallel striped pads, 801, at the bottom are electrically common with the other termination, 602 or 602'. This pad geometry is advantageous because termination extensions, 602 and 602', increase the flexure capability of the capacitor chip, 101, and therefore do not crack as often as those of the "normal" pad geometry.

One variation of the stripped pattern would be to duplicate the pattern on the PCB to the bottom of the ceramic capacitor. This would reduce the solder as the flow is now constricted to these striped pad dimensions, 801, with both the PCB and the capacitor having like patterns. Of main concern with this additional patterning must address any potential added processing cost of the capacitor.

Figure 10:
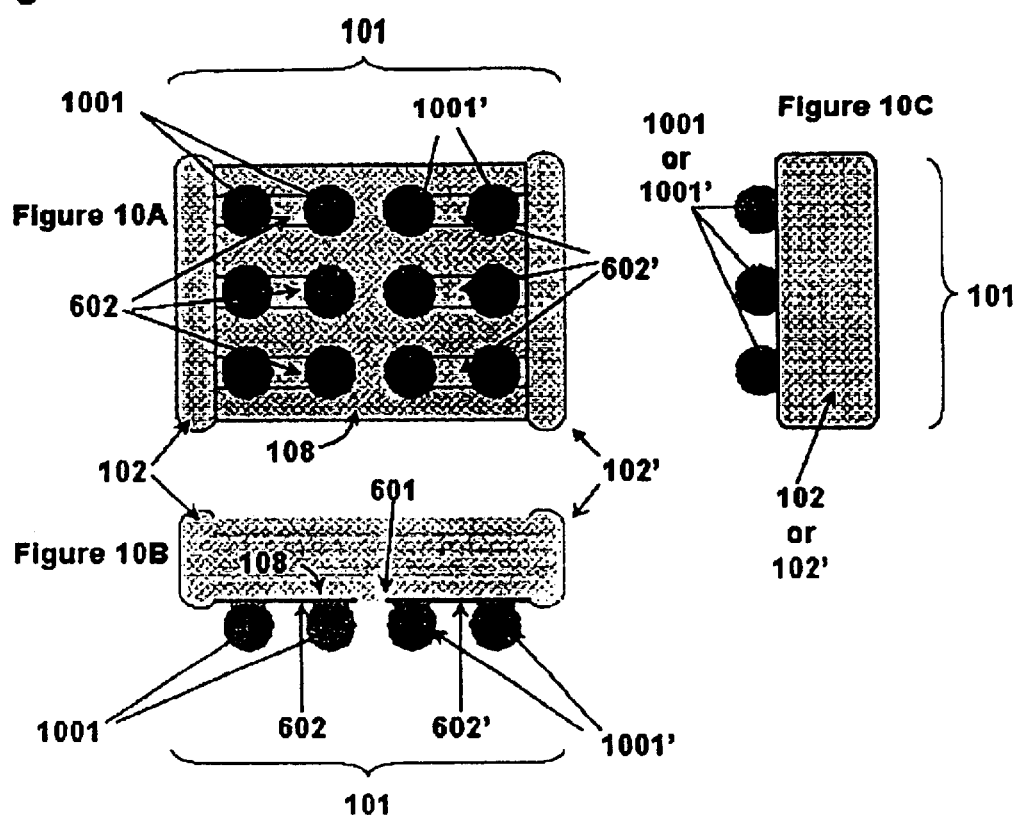
FIGS. 10A, 10B and 10C are drawings of a ceramic chip with ball grid conductive patterns on the bottom side to create the extended termination effect utilizing an array of solder balls to mount to the PCB.

A second method for reducing the massive amount of solder due to full termination extensions, 602 and 602' of FIG. 7, is to create a solder ball array (ball grid array or BGA) on the bottom face of the chip 108, to be attached to a like pattern created on the PCB. FIG. 10 shows three views of the three dimensional ceramic capacitor with the BFA attached on the chip. The array pattern used for affixing the solder balls to the ceramic is created while the extensions, 602 and 602' are applied to the bottom face, 108, of the chip 101. The solder balsa replaced and then partially reflowed to these patterns, 1001 to 602 and 100' to 602' on the ceramic capacitor's, 101, bottom face, 108. These capacitor devices, with solder balls attached, 101 and 100', would then be packaged as a singular device, 101, for pick-and-place pickup, placement, and reflow soldering to the PCB. The narrow gap between the balls would be used to define the narrow gap, 601, of unsupported ceramic between the opposing termination extensions, 602 and 602'. Although this method is used in many applications for mounting devices to the PCB, it may be a method that is costly and full of potential problems with the solder ball integrity, positioning, and planarity. Solder bumps could be used in place of the solder balls.

Figure 11:
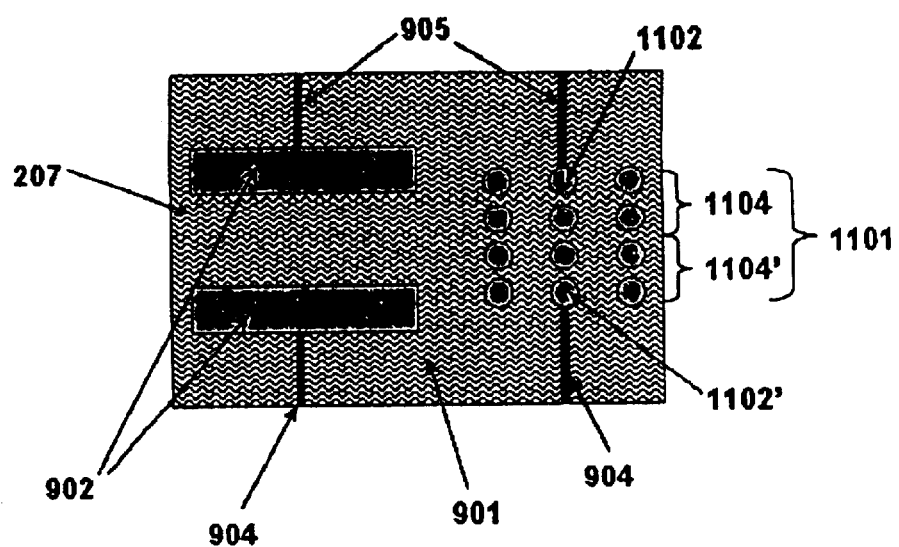
FIG. 11 shows the pad geometries required on the PCB, comparing a standard 2225 chip with extended termination to receive the ball grid array sown in FIGS. 10A through 10C.

FIG. 11 illustrates a PCB, 207, with a BGA solder pad arrangement. Like FIG. 9, on the left of FIG. 11 are two PCB solder pads, 902, which represent the "normal" pad geometry for a 2225 chip capacitor as described above. On the right of FIG. 11, the solder-ball pad arrangement, 1101, is shown. Electrical feeds, 904 and 905 are only required to the outermost solder-ball pads, 1102 and 1102', on each side of the solder-ball pad arrangement, 1101, because the other pads are connected electrically by the termination extensions, 602 and 602' at the bottom of the capacitor. The six solder-ball pads, 1104, at the top half of 1101 are electrically common with one termination, 602 or 602' while the six solder-ball pads, 1004, at the bottom are electrically common with the other termination, 602 or 602'.

INDUSTRIAL UTILITY

The extended terminal ceramic capacitor chip of this invention provides a fracture resistant mounting for larger ceramic capacitors without degrading performance in microprocessor circuits and other electronic uses requiring higher capacitance with improved reliability.

The invention has been disclosed in terms of representative embodiments. Modifications and additions as may be apparent to one skilled in the art are subsumed within the scope of the disclosure.

What is claimed is:

1. A ceramic capacitor comprising:
   a multiplicity of parallel plates in planar relationship wherein each plate terminates at an opposing face in an alternating pattern;
   a dielectric between said parallel plates;
   two external terminations on opposing sides of said capacitor wherein a first external termination is in electrical contact with alternating plates of said multiplicity of parallel plates and a second external termination is in electrical contact with separate alternating plates of said multiplicity of parallel plates;
   at least two conductive terminal extensions applied to the same face between said two terminal extensions and electrically connected to one but not both terminations, said terminal extensions being separated by a gap in the direction of extension.

2. A ceramic capacitor according to claim 1 wherein said conductive terminal extensions are at least as thick as said external terminations on the bottom face of the capacitors.

3. A ceramic capacitor according to claim 1 wherein said terminal extensions may be formed from a different material than said external terminations.

4. A ceramic capacitor according to claim 1 further comprising solder balls or bumps formed in a grid array on said terminal extensions.

* * * * *